United States Patent [19]

Johnson et al.

[11] 4,203,488

[45] May 20, 1980

[54] SELF-FASTENED HEAT SINKS

[75] Inventors: Philip A. Johnson, Melrose, Mass.;
Alfred F. McCarthy, Belmount, N.H.

[73] Assignee: Aavid Engineering, Inc., Laconia, N.H.

[21] Appl. No.: 882,364

[22] Filed: Mar. 1, 1978

[51] Int. Cl.² .................................... H01L 23/40
[52] U.S. Cl. ........................ 165/80 B; 174/16 HS; 357/81; 361/383
[58] Field of Search ........... 165/80, 185, 77, DIG. 7, 165/DIG. 3, 80 R, 80 B; 174/16 HS; 357/79, 81; 361/383, 386, 388

[56] References Cited

U.S. PATENT DOCUMENTS

| | | | |
|---|---|---|---|
| 2,771,278 | 11/1956 | Slack | 165/80 B |
| 2,772,382 | 11/1956 | Escoffery | 165/80 B |
| 2,888,228 | 5/1959 | Jarvis | 165/80 B |
| 3,222,580 | 12/1965 | Curll, Jr. | 165/80 B |
| 3,428,871 | 2/1969 | Scott et al. | 357/81 |
| 4,012,769 | 3/1977 | Edwards | 174/16 HS |

FOREIGN PATENT DOCUMENTS

| | | | |
|---|---|---|---|
| 2014289 | 3/1970 | Fed. Rep. of Germany | 357/79 |
| 94441 | 6/1960 | Netherlands | 357/81 |

*Primary Examiner*—Sheldon Richter
*Attorney, Agent, or Firm*—James E. Mrose

[57] ABSTRACT

Dissipation of heat from miniature solid-state devices and the like is achieved by a resilient heat-sink structure which opens to receive a substantially flat tab or other heat-transfer body freely between two relatively-movable oppositely-disposed broad-area portions of the structure and which then closes and yieldingly holds the two portions about the body as shaped end connectors and sprung and locked as the result of simple manipulations.

2 Claims, 6 Drawing Figures

SELF-FASTENED HEAT SINKS

BACKGROUND OF THE INVENTION

The present invention relates to improvements in heat sinks for electronic components, and, in one particular aspect, to unique resilient sheet-metal heat dissipators of low-cost construction which will close to maintain firm intimate heat-transfer engagements with thermally-conductive tabs or module bodies while being readily openable to admit or release such tabs or bodies without difficulty and with little likelihood of component damage.

As is well known at the current stage or developments in the art, applications of miniature semiconductor devices and microcircuit modules are severely limited in respect of the self-generated heat which they can successfully expel and prevent from building up as they are caused to operate at higher and higher powers. In some instances, the environments of use permit elaborate forced-liquid cooling systems to be employed, but a very common and economical expedient instead involves the attachment of small finned metal extrusions or stampings which help to conduct and radiate heat away from the thermally-vulnerable regions. To further the latter purposes, encapsulated devices or component packages are sometimes provided with exposed heat-transfer parts, such as flat broad-area tabs or plates, which promote thermal-energy transfer to such attachments and thence convectively away into the ambient environment along both its sides. The heat-dissipating attachments intended for use with such heat-transfer parts may include a thin resilient spring clip member cooperating with a rigid and more massive member (as in U.S. Pat. No. 3,548,927), or it may consist of a single stamped sheet-metal body shaped both to promote cooling and to grasp and hold itself in place on the heat-transfer part (U.S. Pat. Nos. 3,893,161 and 4,041,524 and 4,054,901).

Ease and convenience of fitting heat-sink attachments are important factors, as are, also, the creation and maintenance of broad-area heat-exchange pathways between the heat-transfer parts and their attachments. However, when auxiliary fasteners, clips and tools must be used, the fastening operations can become awkward, and, when either auxiliary or integral clipping arrangements are exploited, their designs may cause essentially line-contacting or small-area contacting to occur where one would instead prefer to develop broader contact areas for maximum heat transfer. If intimate tightly-sprung broad-area regions of clamping are instead designed into a heat-sink, it may then be difficult to fix in place or may be impossible to apply without high risk of damage to a device, such as a microcircuit module, whose body and/or numerous leads may be susceptible to injury by large clamping forces. In accordance with the present teachings, such limitations are avoided in heat-sink attachments of low-cost construction which open to admit heat-transfer tabs or modules readily and with reduced likelihood of damage and which are easily snapped to self-fastened closure with broad-area contacting promoting efficient transfer of heat.

SUMMARY OF THE INVENTION

The present invention is aimed at creating self-fastened heat sinks which offer improvements in respect of economical manufacture, ease of use, and promotion of efficient heat-transfers. In one preferred embodiment, such a device is fashioned as a single stamped-sheet-metal element having two flat broad-area portions which are intended to bear against opposite sides of a microcircuit module, semiconductor tab, or a like body, but which are initially held sprung apart in an attitude of opened jaws by action of an integral connecting resilient end loop shaped to expose large surface area to the ambient medium. At the open extremities of the jaw portions, there are simple cooperating spring-catch extensions which will clasp together when the jaws are pressed closed about a body, thereby insuring that the device remains locked in place with good contacting after the body has first been inserted and positioned freely and easily within the device in its fully-opened condition. Spaced finger-like projections from edges of the jaw portions heighten the convection-cooling characteristics of the device. In alternative arrangements, such devices may be fashioned from two cooperating parts, with extensions which will readily fit and hinge together in place of an integral loop connection for the two flat portions, such that assembly around bodies which are to be cooled is a very simple, unobstructed and uncomplicated clasping procedure.

Accordingly, it is one of the objects of the present invention to provide novel and improved miniature heat-sink attachments which are openable to admit members which are to be cooled and which may be easily sprung to closure and intimate and firm broad-area contacting with such members.

A further object is to provide unique and advantageous self-fastening heat sinks of low-cost construction which lend themselves to simple non-obstructing jaw-type clasping into good heat-transfer contacts with semiconductor tabs, modules, and the like.

BRIEF DESCRIPTION OF THE DRAWINGS

Although the aspects of this invention which are considered to be novel are expressed in the appended claims, further details as to preferred practices and as to further objects and features thereof may be most readily comprehended through reference to the following detailed description when taken in connection with the accompanying drawings, wherein:

DETAILED DESCRIPTION OF THE PREFERRED EMBODIMENTS

Figure 1:
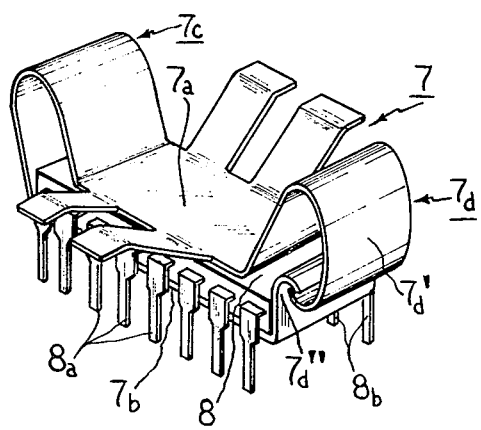
FIG. 1 is a pictorial view of an improved heat-sink attachment in operative heat-dissipating clasping relationship to a miniature circuit module.
Figure 2:
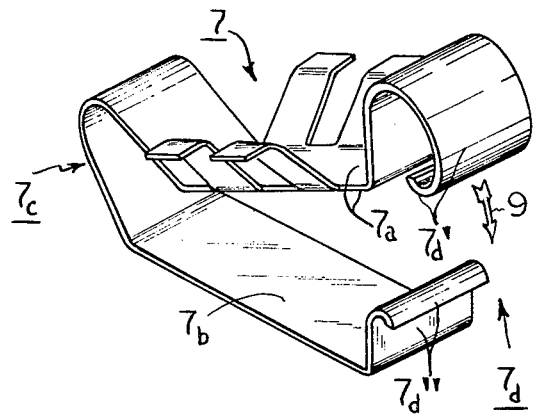
FIG. 2 portrays the attachment of FIG. 1 alone and in an opened condition.

Having reference to the drawings, wherein like reference characters designate identical or corresponding parts throughout the different views, and more particularly to FIG. 1 thereof, one embodiment of an improved heat-sink arrangement 7 is shown in cooperative mated relationship with a multi-terminal microcircuit module body 8, from which it conducts heat and transfers the same convectively to the ambient environment. Typically, such a microprocessor module or the like is molded as a relatively thin rectangular parallelepiped, which may have heat-releasing elements disposed near its top and bottom surfaces and from the opposite thin sides of which extend rows of small terminal pins 8a and 8b; body dimensions of $\frac{1}{8} \times \frac{1}{4} \times \frac{3}{4}$ inch exemplify the miniature proportions which may be involved. Pins 8a and 8b lend themselves to convenient connections with printed circuit board conductors, but a module bristling with such pins does not readily accommodate the attachment and carrying of a heat sink. However, unit 7 fits closely with both the top and bottom surfaces of the module 8, over relatively broad areas, and, in the illustrated thin sheet-metal construction interposes only a thin layer below the module while displaying open end connections and wing-like lateral tabs from the top which help to match the unit into a good convective heat-exchange relationship with the ambient environment. Moreover, the unit 7 opens at one end, as shown in FIG. 2, to allow the module, or another body from which heat is to be withdrawn and dissipated, to be inserted within the space between broad-area sides of the flat heat-transfer elements 7a and 7b of the unit. For purposes of physically complementing the thin rectangular parallelepiped configuration of the body of module 8, the heat-transfer elements 7a and 7b are also of substantially rectangular form and have flat confronting surfaces which are intended to make the illustrated broad-area abutting engagements with the oppositely-disposed spaced planar top and bottom surfaces of the module 8. Differently-shaped bodies may likewise be complemented in shape by the heat-transfer elements, in modified embodiments of the invention, to maximize the areas of abutting engagements and resulting conduction of heat away from such bodies.

The spaced heat-transfer elements 7a and 7b are held frictionally in the desired heat-withdrawing engagements with modules or other bodies by the urgings of somewhat-resilient connection provisions 7c and 7d which project in opposite directions from laterally-opposite edges or ends of these elements. At one end, the elongated connecting means 7c is integral with both elements 7a and 7b and forms a centrally-open loop exposing significant surface area to the ambient environment for heat-dissipation purposes. That integral loop connection also exhibits resilience which aids in compressing the elements together about the module, although in its condition before the module is inserted the loop connection 7c preferably holds the heat-transfer elements angled apart in an open jaw-like attitude, as is depicted in FIG. 2. At the opposite end, the connecting means 7d is in two separable cooperating parts, 7d' and 7d", each integral with a different one of the two heat-transfer elements, 7a and 7b, respectively. Parts 7d' and 7d" have their outermost ends rolled inwardly and outwardly, respectively, so that together they form a simple clasp in which the somewhat resilient sheet metal part 7d' is sprung outwardly and thence inwardly, after the fashion of a pawl, to detend and catch under part 7d", when the unit is manipulated to closure by relative movement of part 7d' in the direction of arrow 9 (FIG. 2). Convective heat-exchange is promoted also by outwardly-projecting tabs or fins, such as the wing-shaped projections 7e and 7f from lateral edges of element 7a.

Figure 3:
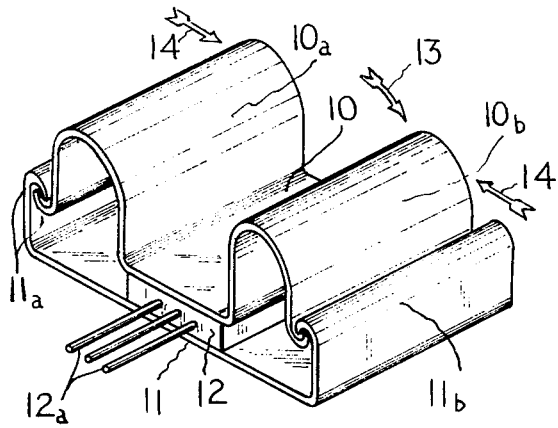
FIG. 3 provides a perspective view of a two-part heat-sink attachment, self-fastened to a flat semiconductor body.

The assembly shown in FIG. 3 likewise involves relatively broad-area planar heat-transfer elements, 10 and 11, which are of sheet metal and are in abutting engagements with opposite sides of a body, 12, associated with a packaged electronic device. The latter form of device has electrical leads 12a extending from one edge; in another use, the body 12 may consist simply of a thermally-conductive flat tab such as commonly extends from a packaged solid-state device. In that assembly, the elongated end connection means 10a and 11a cooperate at one margin while the connection means 10b and 11b cooperate at the other, to clasp and resiliently hold the heat-transfer elements 10 and 11 in the desired frictional broad-area abutting engagements with opposite sides of the body 12. Both connection means are fully separable in this embodiment, and in each instance one end of the cooperating parts is rolled in and the other out, so that the two may detent and lock in the manner described with reference to the embodiment of FIGS. 1 and 2. When the two elements 10 and 11 are to be affixed about a body, one connecting means, such as that formed by parts 10a and 11a, may have the ends thereof fitted together to act as a hinge at one end while the part 10b at the other end is pressed in the direction of arrow 13 to detent and lock itself with part 11b. Alternatively, when the resilience of the parts 10a and 10b admits, the loops thereof may be pressed toward one another in the opposite directions of arrows 14 while the upper element is pressed downwardly into place, such that both end connection means clasp or detent into the desired self-locked condition.

Figure 4:
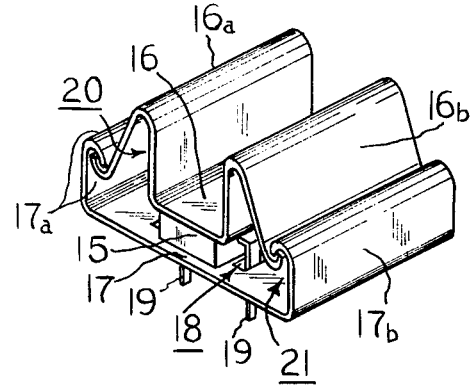
FIG. 4 illustrates a heat-sink attachment of a two-part construction like that of FIG. 3 which is apertured to accommodate a circuit module body.

A microcircuit module 15 is shown to be clasped between heat-transfer elements 16 and 17 in FIG. 4, but the orientation of the module is transverse to that which appears in FIG. 1. Modules of various lengths may be accommodated, within the span of the openings such as slot 18 through which the rows of terminal pins 19 project for the usual connections with printed circuit board conductors. As in the case of the unit of FIG. 3, edge connector means such as 16a and 17a may first be hooked together and connector means 16b then hinged about into clasping detented relationship with connector means 17b, or, alternatively, both connector means 16a and 16b may be separately or simultaneously sprung slightly inwardly as the top element 16 is pressed onto the module 15 resting on the lower element 17, with the result that the connector means catch and hold the elements in the desired abutting engagements with the module or other body from which heat is to be released. The edge connector means 16a and 16b are made elongated and somewhat resilient for clasping purposes, and they are also looped upwardly to provide openings 20 and 21 through which the ambient medium may circulate freely to heighten the convective heat dissipation.

Figure 5:
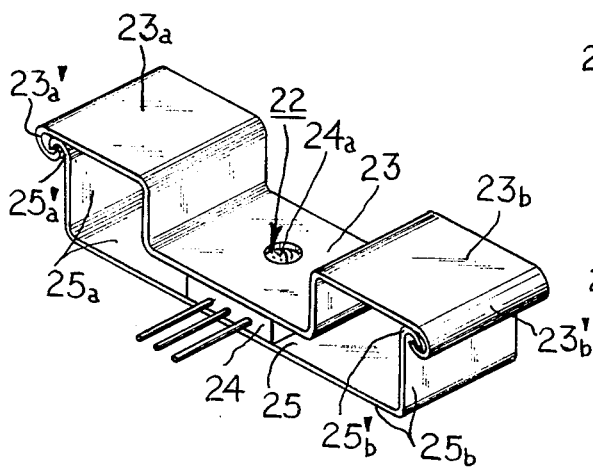
FIG. 5 depicts another form of the heat-sink attachment, with a detent opening and with outwardly-directed hinge and clasp elements which are interchangeable.
Figure 6:
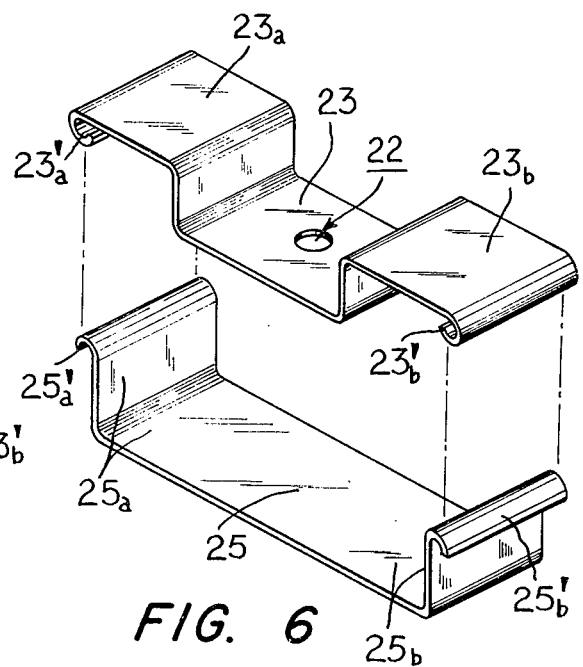
FIG. 6 represents the two parts of the attachment of FIG. 5 in an "exploded" view.

Indexing of the relative positions of the heat-transfer elements and the body to which they are attached may be aided by a locating protrusion from one which fits within a cooperating locating recess or opening in the other. The heat-sink arrangement appearing in FIGS. 5 and 6 is of that type, and exhibits a locating hole 22 through its broad-area heat-transfer element 23; the body 24 with which the element cooperates to effect heat-transfer exhibits a dimple-like protrusion 24a which is received within the hole when the parts are positioned correctly. Often the heat-conducting flat tab of a semiconductor is provided with a like opening, and for purposes of a locating connection therewith the hole 22 in element 23 would instead be a stamped downwardly-extending protrusion or dimple. The edge connection means 23a and 23b for element 23 extend substantially horizontally for a significant distance rather than rising to a greater height to provide the needed surface area and side openings which assure adequate discharge of unwanted heat. Rolled-inward ends 23a' and 23b' of those connection means catch and clasp with the rolled-outward ends 25a' and 25b' of the connection means 25a and 25b extending outwardly and upwardly from the portion 25 which serves as lower heat-transfer element of the unit. Closure of the unit may be effected in a manner as described with reference to the embodiments of FIGS. 3 and 4.

Improved thermal "matching" of the heat-sink units with the ambient environment may be provided by way of fins, fingers, slots, tabs, and the like, at locations accommodating them, even though not specifically illustrated in the drawings. Preferably, both heat-transfer elements, and their connection and clasp means, are fashioned of stamped sheet metal having good thermal conductivity and enough resilience to serve the purposes of fitting and holding. Either or both of the heat-transfer elements may be furnished with heat-dissipating tabs or fingers, and they may also be equipped with integral pin-like projections for locating and mounting on printed circuit boards or the like. One or both of the elements of a fully-separable two-part unit may be cast or may be of something other than stamped sheet metal, with useful results. Although simple detent or pawl-type catches have been shown, other forms of clasping provisions may be substituted where appropriate.

It should therefore be understood that the specific embodiments and practices shown and described herein have been presented by way of disclosure, rather than limitation, and that various modifications, combinations and substitutions may be effected by those skilled in the art without departure in spirit or scope from this invention in its broader aspects and as set forth in the appended claims.

What we claim as new and desire to secure by Letters Patent of the United States is:

1. Self-fastened heat-sink apparatus comprising first and second broad-area heat-transfer elements of bendable and resilient sheet metal each having a substantially flat broad-area side shaped to abut closely with one of two oppositely-disposed spaced surfaces of a body from which heat is to be withdrawn and dissipated, each of said elements having first and second connection means each integral therewith and projecting therefrom substantially in opposite directions from laterally-opposite edges thereof, the first connection means making an unbroken integral loop-shaped connection between nearby edges of said elements and orienting said elements toward one another for abutting engagements of the broad-area sides thereof with the spaced surfaces of a body therebetween while being resiliently bendable to allow said elements to be spread apart angularly in jaw-like fashion to admit a body therebetween and to be moved toward one another for said abutting engagements, said loop-shaped connection being elongated and forming an open passageway alongside a body held between said elements which exposes it to the ambient environment along both its sides through substantially all of its length, at least one of said elements having a plurality of spaced heat-dissipating projections integral therewith along edges between said laterally-opposite edges, and the second connection means being disposed at the edges laterally opposite said one of said nearby edges and including two separate clasp parts each integral with an edge of a different one of said elements and shaped and disposed to detent and catch with one another when said elements are moved toward one another to produce the said abutting engagements, whereby said elements are movable apart to accommodate insertion of a body therebetween and may then be clasped and locked together while maintaining resilient abutting engagements with surfaces of the body therebetween.

2. Self-fastened heat-sink apparatus as set forth in claim 1 wherein said broad-area sides of said heat-transfer elements are substantially flat and of substantially the same width, for abutting engagements with top and bottom surfaces of a body having a thin rectangular parallelepiped configuration, and said loop-shaped connection therebetween is of said same width, and wherein said two clasp parts comprise parallel ends of said second connection means partly rolled outwardly and inwardly, respectively, and open to receive and catch with one another.

* * * * *